US011968905B2

(12) United States Patent
Sun et al.

(10) Patent No.: US 11,968,905 B2
(45) Date of Patent: *Apr. 23, 2024

(54) SPUTTER DEPOSITED CRYSTALLINE ORDERED TOPOLOGICAL INSULATOR/FERROMAGNET (TI/FM) THIN FILM HETEROSTRUCTURES FOR SPINTRONICS APPLICATIONS

(71) Applicant: Northeastern University, Boston, MA (US)

(72) Inventors: Nian-Xiang Sun, Winchester, MA (US); Nirjhar Bhattacharjee, Cambridge, MA (US)

(73) Assignee: NORTHEASTERN UNIVERSITY, Boston, MA (US)

( * ) Notice: Subject to any disclaimer, the term of this patent is extended or adjusted under 35 U.S.C. 154(b) by 275 days.

This patent is subject to a terminal disclaimer.

(21) Appl. No.: 17/365,779

(22) Filed: Jul. 1, 2021

(65) Prior Publication Data
US 2022/0006005 A1    Jan. 6, 2022

Related U.S. Application Data

(60) Provisional application No. 63/047,234, filed on Jul. 1, 2020.

(51) Int. Cl.
*H10N 50/10* (2023.01)
*G11C 11/16* (2006.01)
(Continued)

(52) U.S. Cl.
CPC ........... *H10N 50/10* (2023.02); *G11C 11/161* (2013.01); *H10B 61/00* (2023.02); *H10N 50/01* (2023.02); *H10N 50/80* (2023.02); *H10N 50/85* (2023.02)

(58) Field of Classification Search
None
See application file for complete search history.

(56) References Cited

U.S. PATENT DOCUMENTS 6,313,392 B1 * 11/2001 Sato ................. H10N 10/17
136/203
6,815,244 B2 * 11/2004 Bottner ................ H10N 10/01
438/54

(Continued)

OTHER PUBLICATIONS

Dolui et al. ("Effective spin-mixing conductance . . . Green function approach", Phys. Rev. Mat., 4, 121201 (R), 2020. (Year: 2020).*

(Continued)

*Primary Examiner* — Kevin M Bernatz
(74) *Attorney, Agent, or Firm* — Hamilton, Brook, Smith & Reynolds, P.C.

(57) ABSTRACT

A sputter growth method for a crystalline ordered topological insulator (TI) material on an amorphous substrate, which is possible to use at a CMOS-compatible temperature. The process can be integrated into CMOS fabrication processes for Spin Orbit Torque (SOT) devices. The resulting material can include a thin film crystalline ordered TI layer, sputter deposited on an amorphous substrate, and an adjacent ferromagnetic (FM) layer in which spin-orbit torque is provided by the TI layer, for example to cause switching in magnetic states in a magnetic memory device.

14 Claims, 7 Drawing Sheets

(51) Int. Cl.
  *H10B 61/00* (2023.01)
  *H10N 50/01* (2023.01)
  *H10N 50/80* (2023.01)
  *H10N 50/85* (2023.01)

(56) References Cited

U.S. PATENT DOCUMENTS

| | | | | |
|---|---|---|---|---|
| RE49,797 E | * | 1/2024 | Nikitin | H10N 50/01 |
| 11,871,679 B2 | * | 1/2024 | Kalitsov | H10B 61/00 |
| 11,889,702 B2 | * | 1/2024 | Kalitsov | H10B 61/00 |
| 2018/0182954 A1 | * | 6/2018 | Sayed | H10N 52/00 |
| 2021/0249038 A1 | * | 8/2021 | Le | H10B 61/00 |
| 2021/0280775 A1 | * | 9/2021 | Buhrman | H10N 52/80 |
| 2021/0336127 A1 | * | 10/2021 | Le | H01F 10/329 |
| 2021/0408370 A1 | * | 12/2021 | York | H10N 50/10 |
| 2022/0060149 A1 | * | 2/2022 | Pham | H10N 50/85 |
| 2022/0069202 A1 | * | 3/2022 | Nguyen | G11C 11/161 |
| 2022/0173307 A1 | * | 6/2022 | Sun | G11C 11/161 |
| 2023/0386721 A1 | * | 11/2023 | Le | H10B 61/00 |
| 2024/0005973 A1 | * | 1/2024 | Le | H10N 50/10 |

OTHER PUBLICATIONS

Slonczewski, J.C., "Current-driven excitation of magnetic multilayers", JMMM; vol. 159, Issue 1-2; pp. L1-L7 (1996).
Berger, L, "Emission of spin waves by a magnetic multilayer traversed by a current," Phys. Rev. B; 54(13); 9353-9358 (1996).
Fert, A. et al., "Spin Hall Effect Induced by Resonant Scattering on Impurities in Metals," PRL; 106:157208, pp. 1-10 (2011).
Chen, T.et al., "Spin-Torque and Spin-Hall Nano-Oscillators," Proceedings of the IEEE, vol. 104(10); 1919-1945 (2016).
Manchon, A. et al., "New perspectives for Rashba spin-orbit coupling,", Nature Materials vol. 14; 1-35 (2015).
Liu, L. et al., "Spin-Torque Switching with the Giant Spin Hall Effect of Tantalum," Science; vol. 336; pp. 1-31 (2012).
Jungfleisch, M.B. et al., "Interface-driven spin-torque ferromagnetic resonance by Rashba coupling at the interface between nonmagnetic materials", Physical Review B; 93; 224419; pp. 1-5; (2016).
Mellnik, A.R., et al., "Spin-transfer torque generated by a topological insulator Bi2Se3" Nature; vol. 511; 449-451 (2014).
Belmeguenai, M. et al., "Ferromagnetic-Resonance-Induced Sping Pumping in Co20Fe60B20/Pt Systems: Damping Investigation," J. Phys. D: Appl. Phys.; vol. 51; p. 045002-8 pp. (2018).
Thouless, D.J. et al., "Quantized Hall Conductance in a Two-Dimensional Periodic Potential," Phys. Rev. Lett.; 49(6); 405-408 (1982).
Kane, C.L. et al., "Physics: A New Spin on the Insulating Stale," Science, vol. 314; 1692-1693 (2006).
Hasan, M.Z. et al., "Colloquium: Topological Insulators," Rev Mod Physics; 82(4):3045-3068 (2010).
Tang, C.et al., "Dirac surface state-modulated spin dynamics in a ferrimagnetic insulator at room temperature", Sci. Adv.; vol. 4; pp. 1-6, (2018).
Mahendra D.C et al., "Room-temperature high spin-orbit torque due to quantum confinement in sputtered BixSe(1-x) films", Nature Materials; 17:800-807 (2018).

Mahendra D.C., "Room-temperature spin-to-charge conversion in sputtered bismuth selenide thin films via spin bumping from yttrium iron garnet," Appl. Phys. Lett. 114, 102401 pp. 1-6, (2019).
Guo, Q. et al., "Electrically Tunable Wafer-Sized Three-Dimensional Topological Insulator Thin Films Grown by Magnetron Sputtering," arXiv:1901; .02611; pp. 1-16 (2020).
Wang, Z.H. et al., "Granularity Controlled Nonsaturating Linear Magnetoresistance in Topological Insulator Bi2Te3 Films,", Nano Lett. 14(11); 6510-6514 (2014).
Wei, P. et al., "Exchange-Coupling-Induced Symmetry Breaking in Topological Insulators", Phy Rev Lett; 110(18):186807-1-6 (2013).
Wang, H. et al., "Surface-State-Dominated Spin-Charge Current Conversion in Topological-Insulator/Ferromagnetic-Insulator Heterostructures", PRL; 117:076601-1-076601-13 (2016).
Katmis et al., "A high-termperature ferromagnetic topological insulting phase by proximity coupling," Nature, vol. 533, May 26, 2016, 12 pages.
Kim et al., "Understanding the Giant Enhancement of Exchange Interaction in Bi2Se3—EuS Heterostructures, " Physical Review Letters, PRL 119, 027201 2017.
Lee et al., "Enhanced spin-orbit torque via interface engineering in Pt/CoFeB/MgO heterostructures," APL Mater. 7, 031110, 2019.
Zhu, et al., "Maximizing Spin-Orbit-Torque Efficiency of Pt/Ti Multilayers: Trade-Off Between Intrinsic Spin Hall Conductivity and Carrier Lifetime," Physcial Review Applied 12, 051002 (2019).
Wu et al., "Room-Temperature Spin-Orbit Torque from Topological Surface States," PRL 123, 207205 (2019).
Siegal et al., "Correlating thermoelectric properties with microstructure in Bio.aSbo.2 thin films," APL 110, 141905, 2017.
Buha et al., "Thermal Stability and Anisotropic Sublimation of Two-Dimensional Colloidal Bi2 Te3 and Bi2Se3 Nanocrystals," Nano Lett. 16, 7, 4217-4223, 2016.
Bhattacharjee et al, "Antiferromagnetic VdW Phase at the Interface of Sputtered Topological Insulator/Ferromagnet-Bi2Te3/Ni80Fe20 Heterostructures," arXiv:2110.02845, 2021.
Emori et al., "Spin-orbit torque and spin pumping in VIG/Pt with interfacial insertion layers," Phys. Lett. 112, 182406 (2018).
Zutic et al., "Proximitized materials," Materials Today, vol. 22, pp. 85-107, 2019.
Essert et al., "Using topological insulator proximity to generate perfectly conducting channels in materials without topological protection," New J. Phys. 16, 113058, 2014.
Shoman et al., "Topological proximity effect in a topological insulator hybrid," Nature Comm 6:6547, 2015.
Abe et al., "Ferrite-Plating in Aqueous Solution: A New Method for Preparing Magnetic Thin Film," Japanese Journal of Applied Physics, vol. 22, No. 8, Aug. 1983, pp. L511-L513.
Abe et al., "Ferrite-organic multilayer film for microwave monolithic integrate circuits prepared by ferrite plating based on the spray-spin-coating method," Journal of Applied Physics 63, 3774 (1988).
Kong et al., "Rapid Surface Oxidation as a Source of Surface Degradation Factor for Bi2Se3," ACS Nano 2011, 5, 6, 4698-4703.
N. Bhattacharjee et al., EL03.06.29 : Enhanced Gilbert Damping in Sputter Deposited Topological Insulator/Ferromagnet Heterostructures, MRS 2019.
Liu, et al., "Spin-polarized tunneling study of spin-momentum locking in topological insulators," Phys. Rev. B 91, 235437, 2015.
Requirement for Restriction/Election received for U.S. Appl. No. 17/457,348, dated Dec. 13, 2023, 5 pages.

* cited by examiner

FIG. 7A
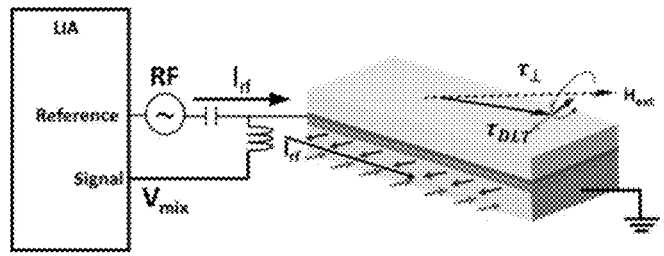
FIG. 7B
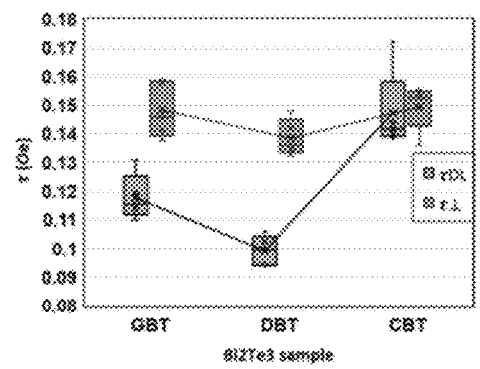
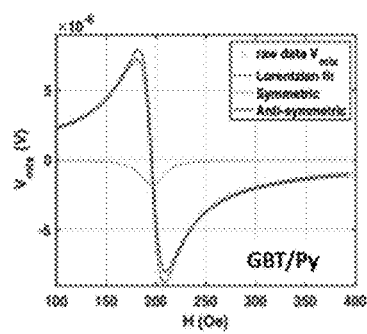
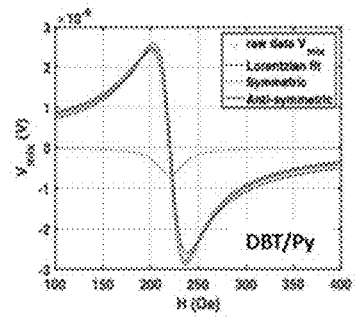
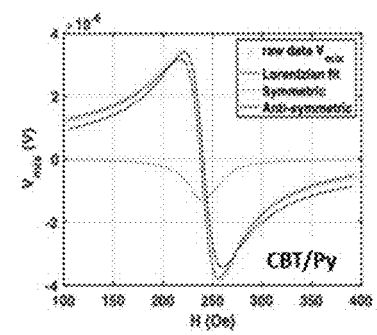
FIG. 7C  FIG. 7D  FIG. 7E

SPUTTER DEPOSITED CRYSTALLINE ORDERED TOPOLOGICAL INSULATOR/FERROMAGNET (TI/FM) THIN FILM HETEROSTRUCTURES FOR SPINTRONICS APPLICATIONS

RELATED APPLICATION

This application claims the benefit of U.S. Provisional Application No. 63/047,234, filed on Jul. 1, 2020. The entire teachings of the above application are incorporated herein by reference.

GOVERNMENT SUPPORT

This invention was made with government support under agreement W911NF-20-P-0009 awarded by the Army Research Office. The government has certain rights in the invention.

BACKGROUND

Topological Insulators (TI) have been reported to provide a high efficiency of spin-orbit torque (SOT) to adjacent magnetic layers to cause switching in magnetic states. This is highly applicable for exciting magnetization oscillations and switching in the magnetic layer in nonvolatile memory devices, such as Magnetic Random Access Memory (MRAM) devices.

Current-driven magnetization oscillations were first proposed by Slonkzewski [1] and Berger [2] in 1996, which formed the basis of research on spin torque nano-oscillators (STNO) and magnetic random access memories (MRAMS). This class of devices utilize the torque provided by non-colinear spin currents with respect to magnetization direction in a ferromagnet (FM) or antiferromagnet (AFM) to excite spin dynamics. With the understanding of the Spin-Hall effect (SHE) [3], different materials coupled with magnetic layers could be characterized to study efficiency of spin current generation. This can be quantified using the parameter Spin-Hall angle ($\theta_{SHA}$), which is defined as the ratio of spin current to charge current densities. The higher the $\theta_{SHA}$ for a certain nonmagnet (NM) material, the higher will be the generated spin current from SHE and consequently the lower will be the charge current required to generate magnetization dynamics in the coupled FM or AFM. The spin current can exert high enough torque in the magnetization of the adjoining FM or AFM to enable resonant excitation or switching [4].

Spin orbit coupling (SOC) arising from relativistic interaction of a particle's spin with its motion inside a potential has been known to be responsible for fascinating material properties such as magnetocrystalline anisotropy [5], Spin-Hall effect (SHE) and Rashba-Edelstein Effect (REE). The magnetic field experienced by a charge carrier in its rest frame $\vec{B} \propto \vec{v} \times \vec{E}$ causes the spin of the particle to depend on electric fields it experiences in a semiclassical model. This property gives rise to high spin accumulation in certain materials (SHE) and in 2D electron gas (2 DEG) systems in thin-film interfaces (REE). These effects have been reported in literature [6,7] and provide additional torques (field-like and damping-like) to a coupled magnetic material to excite dynamic magnetization behavior and switching.

A new class of 3D topological insulators (TI) such as $Bi_2Se_3$, $Bi_2Te_3$ and their family have been shown to possess surface conducting states as a consequence of the topological band structure of the materials. These provide enhanced spin accumulation when coupled with an FM or AFM material. The spin accumulation in these TI materials is thought to be both because of SHE and REE at the TI/FM or TI/AFM interface and can provide an unusually large $\theta_{SHA}$ [8]. This in turn injects extremely high spin orbit torque (SOT) in the FM layer to excite magnetization dynamics using a relatively low current density compared to conventional materials such as heavy metals Pt or Ta. These results are exciting for the memory and logic device industry as this opens up the opportunity to improve the performance of SOT-MRAMS and also for high frequency spin torque nano oscillators (STNO).

However, traditionally, Molecular Beam Epitaxy (MBE) and Pulsed Laser Deposition (PLD) techniques have been used to grow TI thin films. These processes are incompatible for large area film growth required for industrial Complementary Metal Oxide Semiconductor (CMOS) device integration. Moreover, the growth rate of TI thin films that is obtained using these processes is very slow, which makes those processes impossible to integrate into industrial CMOS device fabrication processes.

SUMMARY

A sputter growth method for a crystalline ordered topological insulator (TI) material on an amorphous substrate has been developed in this work, which is possible to use at a CMOS-compatible temperature. The process is attractive, for example, to integrate into CMOS fabrication processes, with a fast deposition rate of the TI material for manufacturing Spin Orbit Torque (SOT) devices. The resulting material can include a thin film crystalline ordered TI layer, sputter deposited on an amorphous substrate, and an adjacent ferromagnetic (FM) layer in which spin-orbit torque is provided by the TI layer, for example to cause switching in magnetic states in a magnetic memory device.

In one embodiment, a thin film heterostructure material comprises a crystalline ordered topological insulator sputter deposited on a substrate comprising an amorphous material. The topological insulator is configured to provide spin-orbit torque to an adjacent ferromagnetic material sufficient to produce at least one of resonant excitation and switching of magnetization in the ferromagnetic material.

In further, related embodiments, the heterostructure material may further comprise the ferromagnetic material, which may comprise at least a portion of a nonvolatile memory device, such as a Magnetic Random Access Memory (MRAM) device, and which may comprise at least a portion of a Complementary Metal Oxide Semiconductor (CMOS) device. The thin film heterostructure material may comprise a distinct interfacial layer of diffused material from the ferromagnetic material in the topological insulator, at an interface of the topological insulator and the ferromagnetic material, the distinct interfacial layer configured to prevent diffusion of material from the ferromagnetic material into the topological insulator towards the substrate. The topological insulator may comprise a surface roughness of less than about 2 nm; and may be configured to provide a spin-mixing conductance on the order of at least $10^{21}$ per square meter in the ferromagnetic material. The ferromagnetic material may comprise a thickness of less than about 10 nm. The topological insulator may comprise a first metal comprising at least one of bismuth and antimony, and a second metal comprising at least one of tellurium and selenium, and may comprise bismuth telluride ($Bi_2Te_3$). The ferromagnetic material may comprise at least one of: cobalt ferrite boron (CoFeB) and a material comprising nickel and iron. The substrate may comprise amorphous silicon. The thin film heterostructure material may further comprise a capping layer to prevent oxidation of the heterostructure material. The topological insulator may comprise a thickness of less than about 50 nm.

In another embodiment, a method of processing a thin film heterostructure material comprises performing physical vapor deposition (PVD) sputtering on a substrate comprising an amorphous material, to thereby obtain a crystalline ordered topological insulator, sputter deposited on the substrate comprising the amorphous material.

In further, related embodiments, the method may further comprise depositing a ferromagnetic material adjacent to the crystalline ordered topological insulator to thereby configure the topological insulator to provide spin-orbit torque in the ferromagnetic material sufficient to produce at least one of resonant excitation and switching of magnetization in the ferromagnetic material. The depositing of the ferromagnetic material may be performed without breaking a vacuum used to perform the physical vapor deposition sputtering of the crystalline ordered topological insulator; and may be performed after cooling the deposited topological insulator on the substrate to room temperature. The physical vapor deposition sputtering to obtain the crystalline ordered topological insulator on the amorphous substrate may be performed at a temperature less than about 450° C.; and such as at a temperature greater than about 160° C. and less than about 450° C.; and further such as greater than about 250° C. and less than about 450° C. The method may further comprise performing at least a portion of a Complementary Metal Oxide Semiconductor (CMOS) manufacturing process; and may comprise forming at least a portion of a nonvolatile memory device.

In other related embodiments, the method may comprise forming a distinct interfacial layer of diffused material from the ferromagnetic material in the topological insulator, at an interface of the topological insulator and the ferromagnetic material, the distinct interfacial layer configured to prevent diffusion of material from the ferromagnetic material into the topological insulator towards the substrate. The topological insulator may comprise a surface roughness of less than about 2 nm.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

in FIG. 6B, DBT/Py; and in FIG. 6C, CBT/Py samples, in an experiment in accordance with an embodiment of the invention.

FIGS. 7A-7E are diagrams showing results of a spin orbit torque (SOT) characterization, in an experiment in accordance with an embodiment of the invention.

DETAILED DESCRIPTION

A description of example embodiments follows.

A sputter growth method for a topological insulator (TI) material has been developed in this work, which is possible to use at a CMOS-compatible temperature. The process is attractive, for example, to integrate into CMOS fabrication processes, with a fast deposition rate of the TI material for manufacturing Spin Orbit Torque (SOT) devices.

The resulting material can include a thin film crystalline ordered TI layer, sputter deposited on an amorphous substrate, and an adjacent ferromagnetic (FM) layer in which spin-orbit torque is provided by the TI layer, for example to cause switching in magnetic states in a magnetic memory device. Ferromagnetic resonance (FMR) experiments conducted on the sputter grown TI/FM heterostructures have shown an order of magnitude enhancement in spin pumping and surface magnetic anisotropy in sputter deposited crystalline TI/FM heterostructures compared to Pt/FM films in literature [9].

Topological insulators have been known to possess topologically protected surface conducting states and Rashba 2D electron gas due to band bending at interfaces. A TI placed in contact with a ferromagnetic metal generates spin-orbit torques on the magnetization in FM. A signature of SOT in FM/TI bilayers is an enchantment of Gilbert damping in FM. SOT in TI/FM films have been reported previously with TI films epitaxially grown with molecular beam epitaxy.

In an experiment in accordance with an embodiment of the invention, there was obtained enhanced Gilbert damping in sputter deposited TI/FM, $Bi_2Te_3$/CoFeB (BT/CFB) films. Experimental results are discussed below, in connection with FIGS. 1, 2A, 2B, 3A, and 3B.

Figure 4:
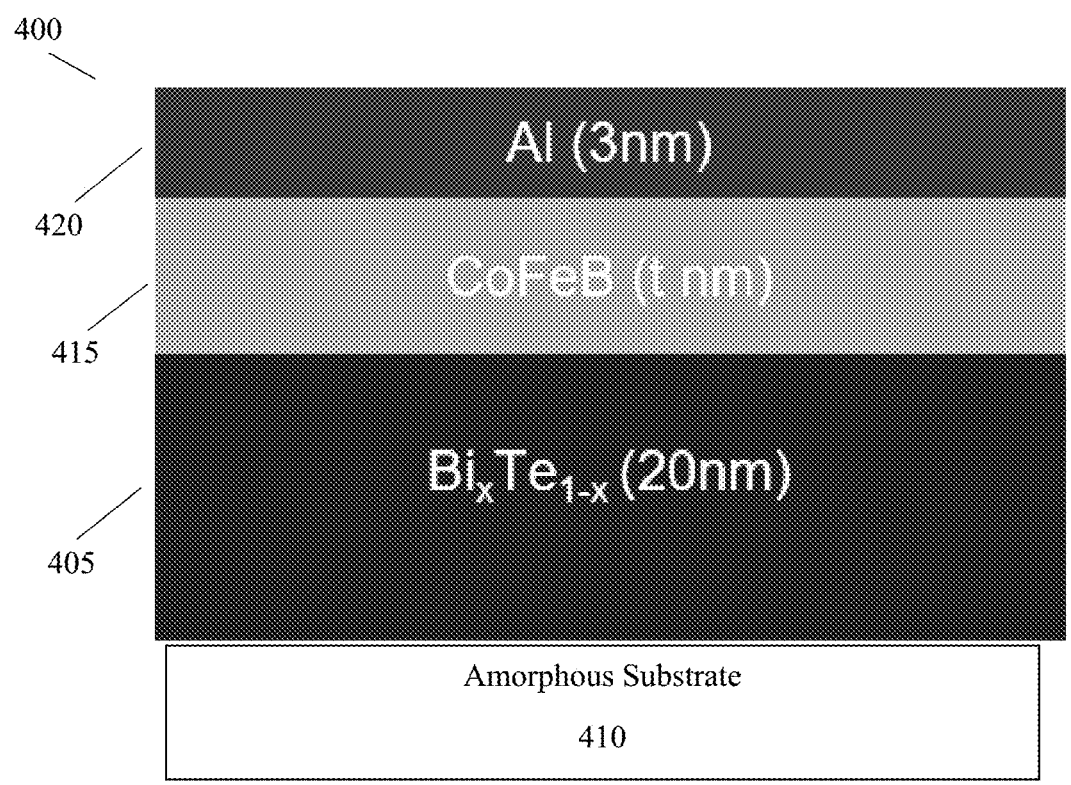
FIG. 4 is a schematic block diagram showing a sample structure of a thin film heterostructure material, in accordance with an embodiment of the invention.

FIG. 4 is a schematic block diagram showing a sample structure of a thin film heterostructure material 400, in accordance with an embodiment of the invention. The thin film heterostructure material 400 comprises a crystalline ordered topological insulator 405 sputter deposited on a substrate 410 comprising an amorphous material. Here, for example, a 20 nm layer of $Bi_xTe_{(1-x)}$ is shown for the topological insulator 405, but it will be appreciated that other thicknesses and compositions of material can be used, such as a thickness of less than about 50 nm. For example, the topological insulator 405 can include a first metal comprising at least one of bismuth and antimony, and a second metal comprising at least one of tellurium and selenium; for example, it can belong to the family (Bi,Sb)$_2$(Te,Se)$_3$. In one example, the topological insulator 405 can be bismuth telluride (Bi$_2$Te$_3$), or another Bi$_x$Te$_{(1-x)}$ material, for x being a suitable value with 0<x<1. The topological insulator 405 can have a surface roughness of less than about 2 nm, such as about 1.3 nm, and can be configured to provide a spin-mixing conductance on the order of at least $10^{21}$ per square meter in the ferromagnetic material. The substrate 410 can, for example, be or include amorphous silicon, although other materials can be used. The topological insulator 405 is configured to provide spin-orbit torque to an adjacent ferromagnetic material 415 sufficient to produce at least one of resonant excitation and switching of magnetization in the ferromagnetic material 415. The switching of the magnetization in the ferromagnetic material 415 can be efficient switching, so that magnetization switching can be achieved using lower power compared to other materials. A layer of CoFeB is shown as an example of the ferromagnetic material 415, although other materials can be used, such as a material comprising nickel and iron, for example an Ni$_x$Fe$_y$, for suitable values of x and y. The thickness of the ferromagnetic material 415, symbolized as "t" in FIG. 4, can, for example, be less than about 10 nm. A capping layer 420 prevents oxidation of the heterostructure material 400. For example, a 3 nm layer of aluminum (Al) is shown in FIG. 4, but other capping layers can be used. The ferromagnetic material 415 can be part of a nonvolatile memory device, such as a Magnetic Random Access Memory (MRAM) device, and can be part of a Complementary Metal Oxide Semiconductor (CMOS) device.

In an embodiment, a method of processing a thin film heterostructure material 400 includes performing a physical vapor deposition sputtering on a substrate 410 comprising an amorphous material, to thereby obtain a crystalline ordered topological insulator 405, sputter deposited on the substrate 410 comprising the amorphous material. For example, the physical vapor deposition sputtering to obtain the crystalline ordered topological insulator 405 on the amorphous substrate 410 can be performed at a temperature less than about 450° C.; such as at a temperature greater than about 160° C. and less than about 450° C.; and further such as greater than about 250° C. and less than about 450° C. The sputtering can be performed with a fast deposition rate of the TI material for manufacturing Spin Orbit Torque (SOT) devices, such as a deposition rate of about 0.2 nm/second, or more. A ferromagnetic material 415 can be deposited adjacent to the crystalline ordered topological insulator 405 to thereby configure the topological insulator 405 to provide spin-orbit torque in the ferromagnetic material 415 sufficient to produce at least one of resonant excitation and switching of magnetization in the ferromagnetic material 415. The depositing of the ferromagnetic material 415 can be performed without breaking a vacuum used to perform the physical vapor deposition sputtering of the crystalline ordered topological insulator 405; and can be performed after cooling the deposited topological insulator 405 on the substrate 410 to room temperature. The method can further include performing at least a portion of a Complementary Metal Oxide Semiconductor (CMOS) manufacturing process; and can include forming at least a portion of a nonvolatile memory device, such as a CMOS manufactured memory device that includes the ferromagnetic material 415.

Figure 5:
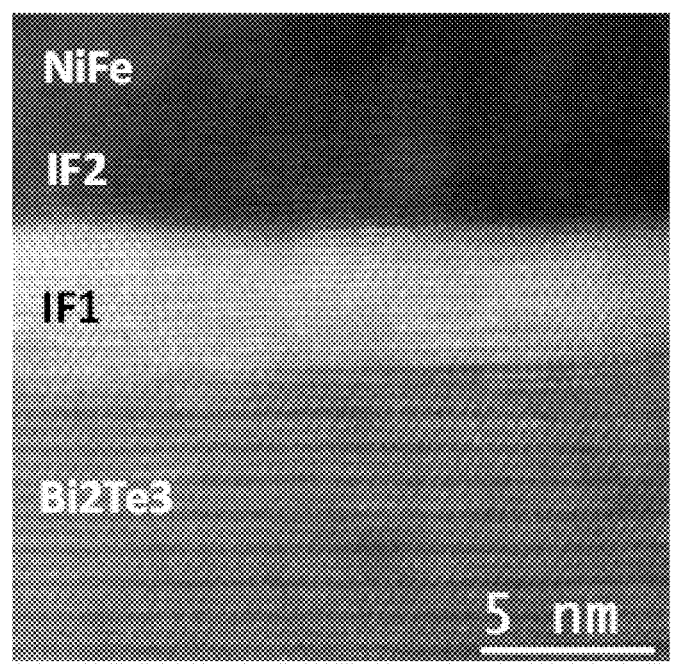
FIG. 5 is a STEM-HAADF image showing a clear interfacial layer of $Ni_x(Bi_2Te_3)_{1-x}$ in a CBT/Py sample, formed in an experiment in accordance with an embodiment of the invention.
Figure 6A:
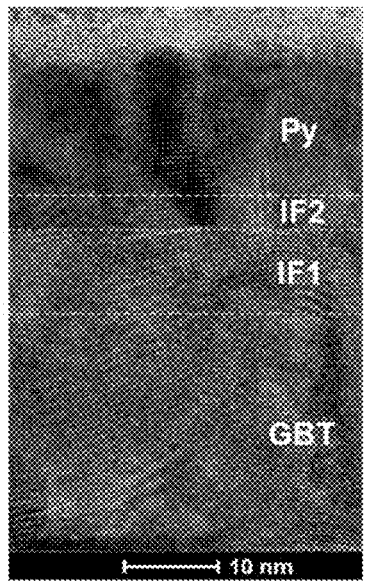
FIGS. 6A-6C are HRTEM images showing, in FIG. 6A, GBT/Py.
Figure 6B:
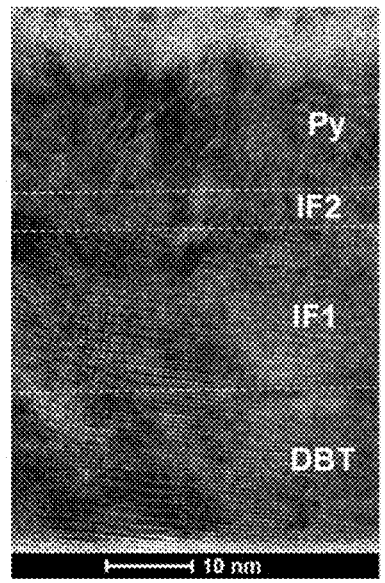
Figure 6C:
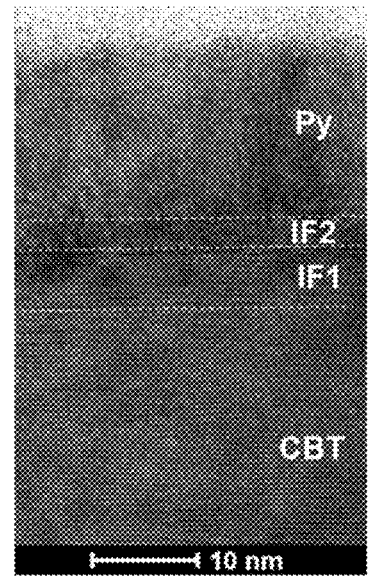
Figures 6D, 6E, 6F:
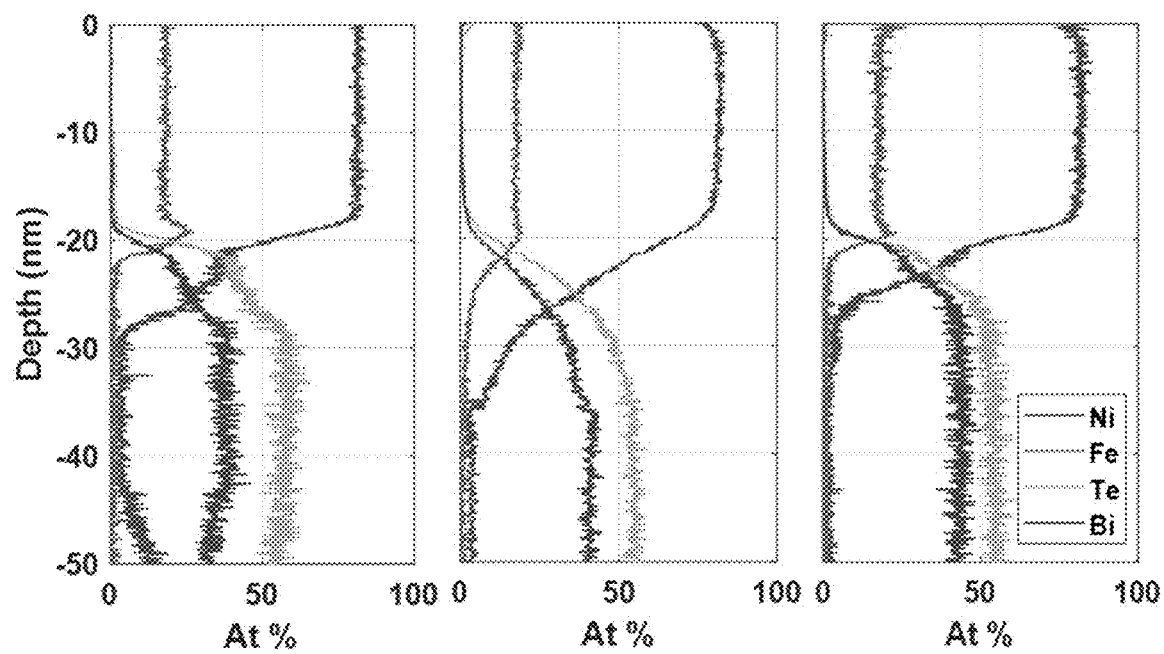
FIGS. 6D-6F are diagrams showing atomic percent for composition analysis of the GBT/Py, in FIG. 6D; the DBT/Py, in FIG. 6E; and the CBT/Py, in FIG. 6F; showing clear change in interfacial layer thickness and composition profile for varying crystalline properties of $Bi_2Te_3$, in an experiment in accordance with an embodiment of the invention.

FIG. 5 is a STEM-HAADF image showing a clear interfacial layer of Ni$_x$(Bi$_2$Te$_3$)$_{1-x}$ in a CBT/Py sample, formed in an experiment in accordance with an embodiment of the invention, described further below (see Experiment #4). Thin film heterostructure materials in accordance with the invention can include a distinct interfacial layer, such as layer IF1 in FIG. 5, of diffused material from the ferromagnetic material, in the topological insulator. Here, the topological insulator was Bi$_2$Te$_3$, and the ferromagnetic material was an Ni$_{80}$Fe$_{20}$ alloy material (known as Permalloy, "Py"). It was found that nickel from the Ni$_{80}$Fe$_{20}$ alloy layer diffused into the topological insulator, and formed the layer IF1 at an interface of the topological insulator and the ferromagnetic material. The distinct interfacial layer IF1, which is itself formed of diffused material from the ferromagnetic layer, has been found to be configured to prevent further diffusion of material from the ferromagnetic material into the topological insulator towards the substrate. This is believed to be advantageous for reliable performance of TI/FM heterostructures when fabricated as devices, such as CMOS devices and memory devices. The distinctness of the interfacial layer IF1 was not found to occur when non-crystalline ordered TI materials were sputter deposited, namely when granular and polycrystalline disordered TI materials were deposited.

Spin Transfer-Torque in TI/FM Heterostructures

In TI/FM heterostructures, precession of magnetization in the FM layer generates spin current which is injected into the nonmagnet (NM) layer given by the relation $$J_s = \frac{\hbar}{4\pi} g_{\uparrow\downarrow} \hat{m} \times \frac{d\hat{m}}{dt},$$

where $\hat{m}$ is the magnetic moment in the FM layer and $g_{\uparrow\downarrow}$ is the real part of spin mixing conductance [9]. The value of $g_{\uparrow\downarrow}$ depends on the interface properties between certain FM/NM. The NM layer acts as a spin sink and enhances the value of Gilbert damping, $\alpha_G$ in the FM/NM heterostructure compared to the FM film. In FMR experiments, the value of $g_{\uparrow\downarrow}$ can be calculated using the equation, $$g_{\uparrow\downarrow} = \frac{4\pi M_s d_{FM}}{\gamma \hbar} \Delta\alpha.$$

Here, $\Delta\alpha$ is the change in Gilbert's damping of the FM/NM heterostructure compared to the FM film ($\Delta\alpha = \alpha_{FM/NM} - \alpha_{FM}$), $M_s$ is the saturation magnetization obtained from fitting Kittel's equation $$\left(f_{res} = \frac{\gamma}{2\pi} \sqrt{H(H + 4\pi M_s)}\right),$$

$d_{FM}$ is the thickness of the FM layer, $\gamma$ is the gyromagnetic ratio and h is the Plank's constant.

Recently there has been an increase in interest in studying interface effects in various TI/FM heterostructures fueled by high spin pumping effects observed in these materials. Mellnik et al [8] reported a significantly high Spin Hall angle (SHA) of 2.0-3.5 in Bi$_2$Se$_3$/NiFe heterostructures which are ~40 times higher than that reported in Pt. Further, Tang et al [13] confirmed the presence of Dirac surface states as the reason for enhanced spin pumping and change in magnetic anisotropy in TI/FM heterostructures (FIG. 2). Typical values of $g_{\uparrow\downarrow}$ for TI/FM (FM) heterostructures reported in literature are higher [19] than that for Pt/FM values of ~$5\times10^{18}$ m$^{-2}$[9].

Most of the reports in literature have utilized molecular beam epitaxy (MBE) grown TI films for studying TI/FM spin dynamics. Mahendra et al [14,15] reported on spin pumping using sputtered granular $Bi_xSe_{(1-x)}$ films deposited at room temperature. Although these films exhibit finite spin pumping comparable to heavy metals (HM), they have much lower magnitude of $g_{\uparrow\downarrow}$ compared to epitaxial TI films. This suggests either lack of or very weak TI surface states in these granular sputtered films and emphasizes the need to grow crystalline TI films for spin-torque aided magnetization dynamic device applications.

Experimental #1

Samples of 20 nm BT film were grown on a Si/SiO$_2$ substrate at 250° C. and at 30° C. followed by 20 nm CFB deposition at 30° C. (room temperature) using RF and DC magnetron sputtering respectively. X-ray diffraction (XRD) measurements reveal a crystalline 250° C. BT film compared to an amorphous 30° C. BT film. Room temperature broadband ferromagnetic resonance (FMR) measurements were performed for 250° C. and 30° C. heterostructures and a control sample where the TI was substituted with 3 nm Al. A full width at half maximum (FWHM) resonance linewidth was extracted as a function of frequency to calculate Gilbert's damping. The 250° C. sample showed a giant enhancement in linewidth. The Gilbert damping coefficient, α, for 250° C. sample is α=0.073, compared to α=0.026 for 30° C. and α=0.009 for control. The calculated spin-mixing conductance for 250° C. sample is $g_{\uparrow\downarrow}$=2.4e21 m$^{-2}$ which is in an order of magnitude higher than reported value for CFB/Pt films, that is, on the order of about $10^{21}$ m$^{-2}$ as opposed to $10^{20}$ m$^{-2}$. Moreover, the presence of the crystalline TI on FM induces static effects on the magnetization. M-H loop measurements reveal emergence of out of plane magnetic anisotropy (OPMA) for the 250° C. sample at lower thicknesses (<10 nm) of CFB films. This change in the magnetic anisotropy and enhanced spin pumping in the BT/CFB heterostructure is attributed to the presence of Topological Surface States and Rashba 2 DEG because of strong spin-orbit coupling at the interface, which is enhanced for the crystalline phase of BT.

Experimental #2: Sputter Deposition Process for TI Crystalline Films

Molecular beam epitaxy (MBE) processes used to grow TI thin films have a low growth rate and high deposition temperature which is incompatible with industrial Complementary Metal Oxide Semiconductor (CMOS) processes [16]. Physical vapor deposition (PVD) sputtering has been the most popular industrial thin film growth technique because of fast growth rate and the degrees of freedom available in terms of controlling the film properties, such as angstrom level thickness control, stoichiometric composition and crystallinity.

Figure 1:
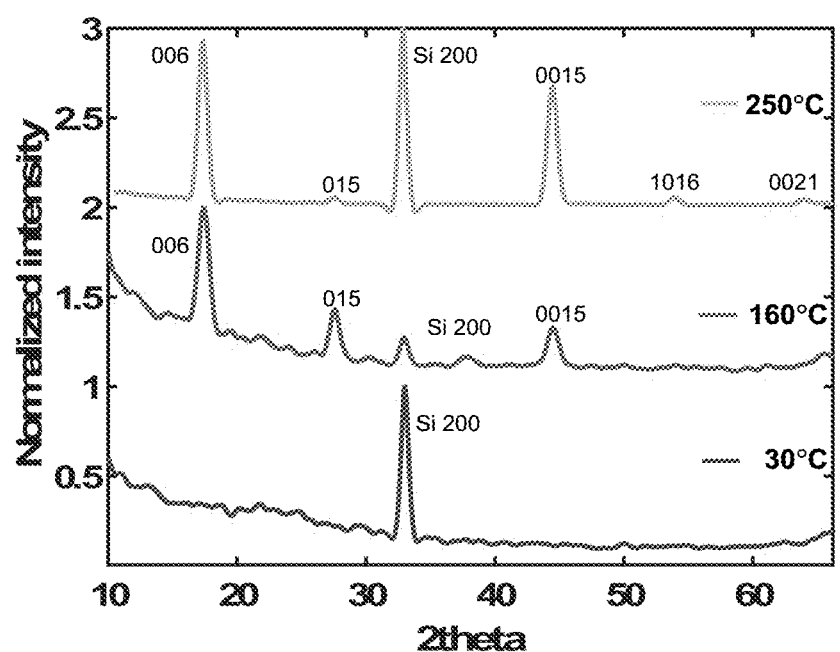
FIG. 1 is a diagram showing XRD spectra of sputtered TI $Bi_xTe_{(1-x)}$ films grown at 30° C., 160° C., and 250° C., in an experiment in accordance with an embodiment of the invention.

In this experiment, there was developed a process to grow sputtered TI film by controlling the deposition conditions. A composite $Bi_2Te_3$ target was co-sputtered with Te target using RF magnetron sputtering at 90 W and 20 W respectively and 4 mT pressure. The base pressure was recorded to be ~3e−7 Torr. By controlling the process temperature, the degree of crystallinity of the TI film was controlled as shown in FIG. 1. The film was further annealed inside the PVD process chamber in 45 mT pressure for 25 minutes at the process temperature value. The substrate with BT film was allowed to cool to room temperature in high vacuum environment of the PVD chamber before the FM layer was grown using DC magnetron sputtering. X-ray diffraction measurements (FIG. 1) showed amorphous films at room temperature (~30° C.), but enhanced crystallinity with increase in process temperature of 160° C. and 250° C., which is needed to attain the topological surface states. In the 250° C. film, the peaks at (006) and (0015) show enhanced crystallinity, which is also present, although somewhat less pronounced, in the 160° C. film.

Figure 2A:
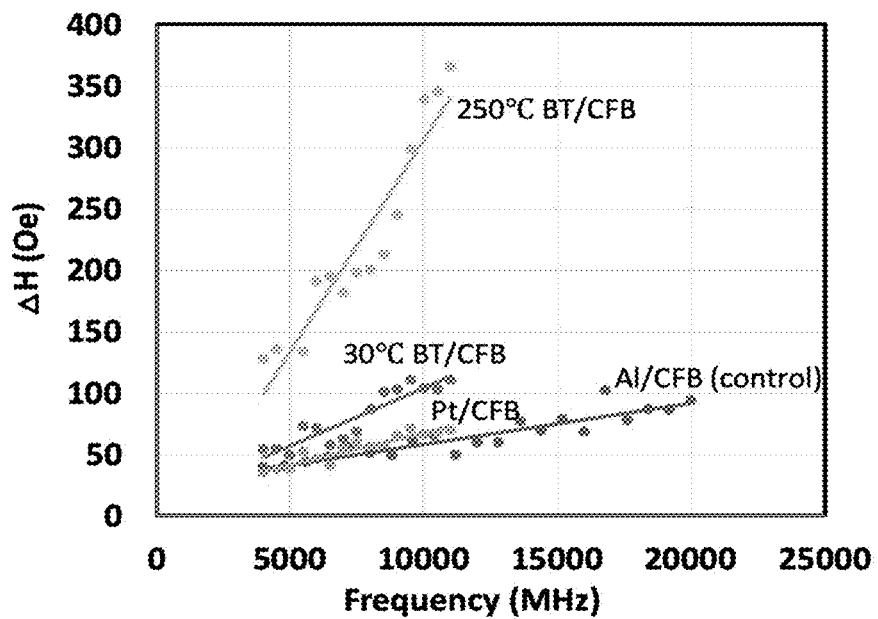
FIG. 2A is a diagram showing FMR linewidth in 250° C., 30° C., and control samples (dots), linear fit (lines), in an experiment in accordance with an embodiment of the invention.
Figure 2B:
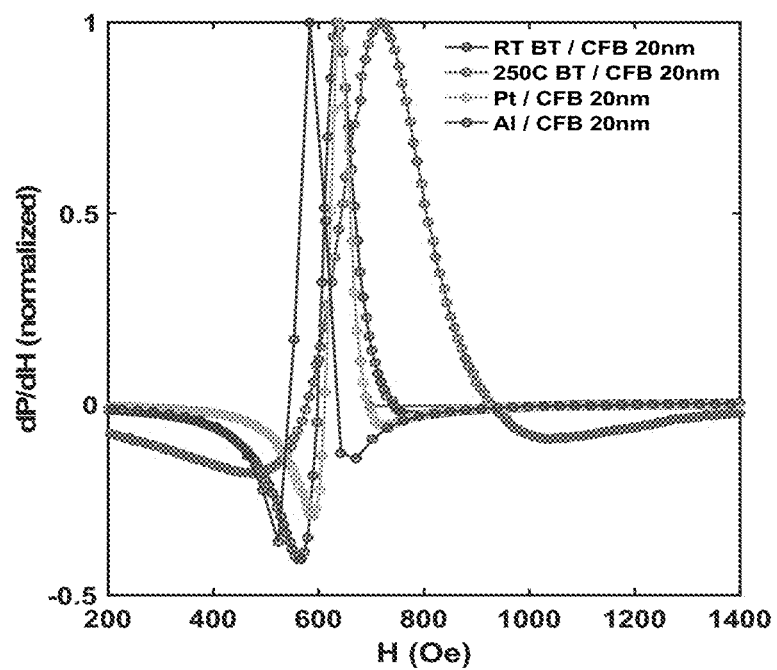
FIG. 2B is a diagram showing FMR linewidth for the samples of FIG. 2A at 9 GHz, in an experiment in accordance with an embodiment of the invention.
Figure 3A:
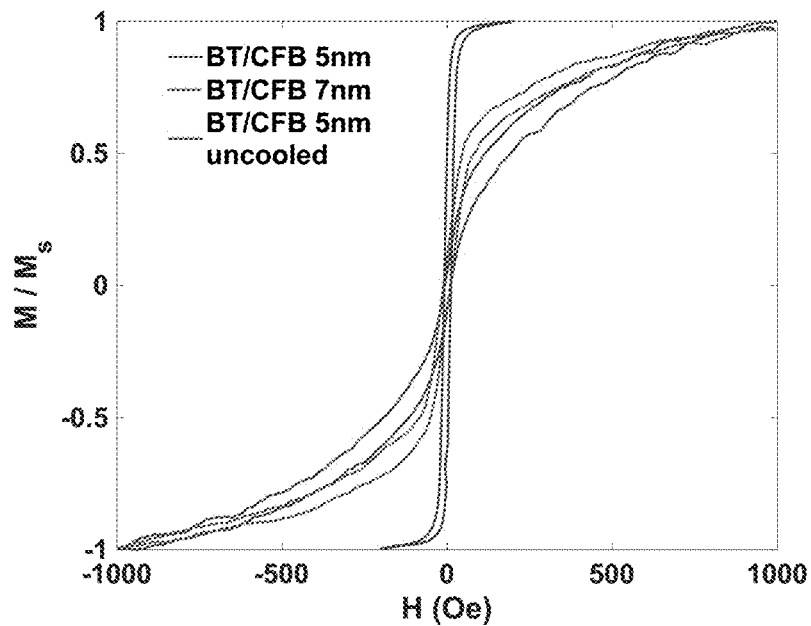
FIG. 3A is a diagram showing SQUID measurements showing emergence of OOP anisotropy for 250° C. BT/CoFeB (5 nm, 7 nm) samples, in an experiment in accordance with an embodiment of the invention.
Figure 3B:
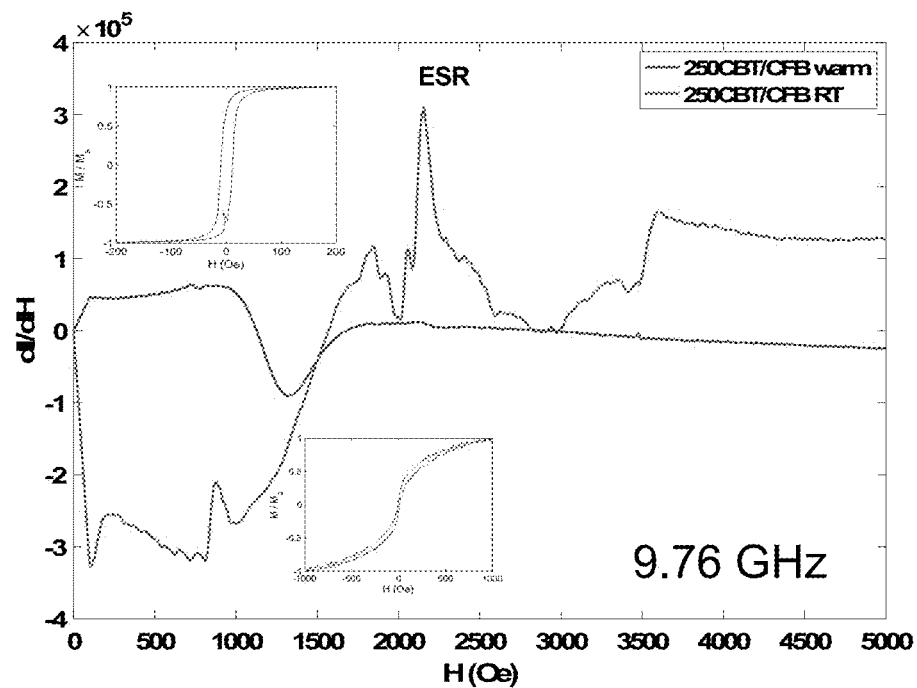
FIG. 3B is a diagram showing ESR measurements for the samples of FIG. 3A, showing no enhancement in linewidth for the diffused interface sample compared to the clean interface sample, in an experiment in accordance with an embodiment of the invention.

Experimental #3: Spin Pumping and Spin Mixing Conductance in TI/FM Heterostructures A signature of SOT in FM/TI bilayers is an enhancement of Gilbert damping in FM. Samples of 20 nm $Bi_xTe_{(1-x)}$ film were grown on a Si/SiO$_2$ substrate at 250° C. and at 30° C. followed by 20 nm CoFeB deposition at 30° C. (room temperature) using RF and DC magnetron sputtering respectively. Room temperature broadband ferromagnetic resonance (FMR) measurements were conducted for 250° C. and 30° C. heterostructures and a control sample where the TI was substituted with 3 nm Al. A full width at half maximum (FWHM) resonance linewidth was extracted and is shown in FIGS. 2A and 2B as a function of frequency. The 30° C. sample showed a small enhancement in linewidth, but the linewidth of the 250° C. sample is much broader. The Gilbert damping coefficient, $\alpha_G$, for 250° C. sample is $\alpha_G$=0.073, compared to $\alpha_G$=0.026 for 30° C. and $\alpha_G$=0.009 for control. The calculated spin-mixing conductance for 250° C. sample is $g_{\uparrow\downarrow}$=~2.4×10$^{21}$ m$^{-2}$ which is an order of magnitude higher than reported value for CFB/Pt films [9] as shown in FIGS. 2A and 2B. Moreover, the presence of the crystalline TI on FM induces static effects on the magnetization. M-H loop measurements for samples with low thickness (<10 nm) CFB reveal an emergence of out of plane (OOP) magnetic anisotropy for the crystalline 250° C. only. This OOP anisotropy was however suppressed (see FIG. 3A) when the CoFeB layer was grown on the BT without cooling to room temperature. This suppression of OOP anisotropy suggests the absence of SOC effects on the TI/FM interface. In order to further understand the effect of suppression on spin pumping, we conducted electron spin resonance (ESR) measurement on the samples in an X-band (9.76 GHz) resonance cavity. As shown in FIG. 3B, we observed a giant enhancement in the 250° C. BT/CFB sample which had CFB grown at room temperature. The sample with high temperature growth of CFB did not show any enhancement in linewidth as expected due to absence of SOC effects.

In another experiment, it was found that surface oxidation has an effect on interfacial SOC effects of the $Bi_xTe_{(1-x)}$. $Bi_xTe_{(1-x)}$ was deposited at 250° C. and exposed to atmosphere. CoFeB of thickness 5 nm was deposited on all samples. FMR and VSM measurements were performed. It was found that the surface oxidation from exposing the samples to the atmosphere appeared to suppress SOC effects: spin pumping was diminished (linewidth and damping were the same as control CFB sample) and OOP magnetic anisotropy was diminished.

Experimental #3: Conclusion

3D TIs have been shown to possess with surface conducting states and enhanced Rashba effect due to high SOC in the materials. Enhanced efficiency of spin to charge current conversions and higher efficiency of SOT in 3D TI/FM heterostructures have been reported in literature. But the vast majority of literature reports have been carried out on epitaxial MBE grown TI films, and not with polycrystalline TI films.

A successful sputter growth method will provide the potential for seamless integration of TI/FM heterostructures into conventional CMOS processes. Here, there has been reported successful growth of crystalline oriented TI $Bi_xTe_{1-x}$ films using CMOS compatible temperatures and sputtering process. The growth method for TI/FM heterostructures demonstrates giant enhancement of FMR linewidth and OOP magnetic anisotropy when the TI film is cooled to room temperature and FM layer is grown on it. This effect is completely suppressed when the FM layer is grown at higher temperatures on the TI layer.

Experimental #4

Topological Insulators are Van der Waals chalcogenide materials and are susceptible to interfacial diffusion when coupled with metallic thin films. This experiment investigated growth of topological insulator $Bi_2Te_3$ using magnetron sputtering possessing varying crystalline properties: granular, disordered polycrystalline and high-quality crystalline ordered. Crystalline order dependent interfacial composition, magnetic and spin-orbit torque properties were studied in $Bi_2Te_3$ coupled with ferromagnetic alloy $Ni_{80}Fe_{20}$. Significant reduction in magnetic moments of the $Bi_2Te_3/Ni_{80}Fe_{20}$ samples was observed because of diffusion of elements across the interface. High Resolution Transmission Electron Microscopy imaging and Energy-dispersive X-ray spectroscopy showed noticeable difference in thickness and elemental composition of interfacial phases with change in crystalline property of $Bi_2Te_3$ in $Bi_2Te_3/Ni_{80}Fe_{20}$ heterostructure systems: samples with granular and disordered $Bi_2Te_3$ had unusually deep interfacial diffusion of Ni which will likely lead to reliability concerns for integration in CMOS devices. However, the crystalline ordered sample had dense and thinner Ni rich interfacial layers which eventually acts as a barrier against further diffusion.

The growth of high-quality c-axis oriented crystalline ordered TI $Bi_2Te_3$ thin film with nominal surface roughness on thermally oxidized Si substrate was achieved, using magnetron sputtering. The interfacial phases and resulting magnetic and SOT characteristics of TI/FM heterostructures dependent on crystalline ordering of the TI layer, were investigated. Granular $Bi_2Te_3$ (GBT), polycrystalline disordered $Bi_2Te_3$ (DBT) and c-axis oriented crystalline $Bi_2Te_3$ (CBT) were deposited using magnetron sputtering followed by $Ni_{80}Fe_{20}$ (Permalloy, Py) as the FM layer on thermally oxidized Si substrate. The nomenclature of the samples is based on the crystalline property of the $Bi_2Te_3$ layer. The granular sample, GBT had a small grain size of 8 nm, the polycrystalline disordered and crystalline ordered samples, DBT and CBT, had larger grain size of 16-18 nm.

Samples of GBT, DBT and CBT of thickness 30 nm were deposited using magnetron sputtering at process temperatures: 20° C., 160° C. and 250° C. respectively and 4 mTorr Ar pressure. 3 nm of Al was then deposited at room temperature as capping layer which was oxidized to AlOx upon exposure to atmosphere. This capping layer was deposited to prevent oxidation of the $Bi_2Te_3$ sample surfaces.

XRR measurements were performed for characterization of thickness and surface roughness of the $Bi_2Te_3$ samples. From the fitting of XRR reflectivity, a thickness of ~30 nm was obtained for all three samples. The surface roughness obtained from the fits were 0.7 nm, 1.7 nm and 1.3 nm for the GBT, DBT and CBT samples respectively, which are typical surface roughness values for sputter deposited thin films.

Next, GBT/Py, DBT/Py and CBT/Py heterostructure samples were grown on 5×6 mm² thermally oxidized Si substrates. The thickness of the $Bi_2Te_3$ and Py layers were maintained at 30 nm and 20 nm respectively to characterize the interface layers and resulting magnetic properties of the heterostructures.

The Py layer was deposited at room temperature on all the samples without breaking the chamber vacuum. All the samples were capped with 3 nm of TiOx to prevent oxidation of Py.

It was found that there was an increase in OOP anisotropy, which was concluded to be due to reduction in magnetic moments resulting in reduced magnetization with increase in crystallinity and formation of ordered van der Waals (VdW) layers of $Bi_2Te_3$.

In order to understand the loss of magnetic moments and image the cross section of the sputtered $Bi_2Te_3/Py$ samples with varying crystalline properties, HRTEM imaging was performed along with XEDS characterization of cross section as shown in FIG. 6. For the $Bi_2Te_3$ region as shown in FIGS. 6A-6C, there is clearly observed small randomly oriented domains of VdW structures along with amorphous grains of $Bi_2Te_3$ in GBT. The randomly oriented domains of VdW crystalline structures increased in size in the DBT samples. But the CBT sample had the VdW layers orderly stacked and oriented normal to the substrate plane proving c-axis oriented crystalline growth of $Bi_2Te_3$. From XEDS depth profile of the samples there was obtained the atomic ratio of Bi:Te in the $Bi_2Te_3$ region to be between 0.65-0.67 which shows almost stoichiometric compositions. XEDS characterization of the BT/Py heterostructures also showed significant difference in the thickness and composition of the interface phases with change in crystalline order of the $Bi_2Te_3$ layer as shown in FIGS. 6D-6F. FIG. 6F shows a distinct interfacial layer of diffused material (here, Ni), with a dense, well-defined band of diffused material found adjacent to the interface between the ferromagnetic layer and the topological insulator in a cross-section of a heterostructure material, with the composition by atomic percentage of the diffused material in the topological insulator approaching zero rapidly outside the well-defined band of diffused material, as can be seen by the contrast in the nickel composition fall-off as one moves vertically down from a depth of 20 nm in FIGS. 6D, 6E, and 6F. The elemental composition of the cross section of the samples showed clean interface phases of ~5 nm of $Ni_x(Bi_2Te_3)_{1-x}$ (x=40%) and ~3 nm of $Ni_aFe_b(Bi_2Te_3)_{1-(a+b)}$ (a=70%, b=22%) for the CBT/Py sample. However, the polycrystalline disordered $Bi_2Te_3$ samples of GBT/Py and DBT/Py had much deeper penetration of Ni, Fe in $Bi_2Te_3$ and $Bi_2Te_3$ into Py region and non-stoichiometric Bi:Te ratios. In the GBT/Py sample, in FIG. 6D, there was surprisingly observed finite amounts of Ni all the way to the substrate which highlights the issues facing integration of granular TIs in spintronic devices.

Materials and Methods for Material Growth, Experimental #4

30 nm $Bi_2Te_3$ was grown by co-sputtering a composite $Bi_2Te_3$ target with Te target using RF magnetron sputtering at 90 W and 20 W respectively with 4 mT process pressure on a thermally oxidized Si substrate. The base pressure of the sputtering chamber was recorded as ~2×10⁻⁷ Torr. The GBT, DBT and CBT samples were grown with substrate maintained at 20° C., 160° C. and 250° C. respectively. The 160° C. DBT and 250° C. CBT samples were further annealed inside the PVD process chamber in 45 mTorr pressure in Ar environment for 25 minutes at their respective process temperatures. The samples were capped with 2 nm AlO$_x$ at room temperature before breaking vacuum for X-ray and conductivity measurements. For the magnetic and STFMR experiments, 20 nm Py and 3 nm TiO$_x$ capping was deposited at room temperature after deposition of Bi$_2$Te$_3$.

Experimental #5

FIGS. 7A-7E are diagrams showing results of a spin orbit torque (SOT) characterization, in an experiment in accordance with an embodiment of the invention. FIG. 7A is a schematic diagram of the ST-FMR experiment. FIG. 7B shows damping like DL-SOT and perpendicular torque components for the GBT, DBT, and CBT samples. FIGS. 7C, 7D, and 7E show the ST-FMR signal with extracted symmetric and antisymmetric Lorentzian components for the GBT/Py, DBT/Py, and CBT/Py samples. FIGS. 7C, 7D, and 7E are ST-FMR signals measured at 4 GHz for GBT/Py, DBT/Py, and CBT/Py, respectively. FIG. 7E shows that DL-SOT is enhanced in crystalline ordered TI, Bi$_2$Te$_3$ film (CBT), which corresponds to FIGS. 6C and 6F, discussed in Experimental #4, above.

Example Advantages and Fields of Use

Embodiments taught herein can, for example, achieve enhanced Spin-Orbit Coupling (SOC) and Topological Surface States in a sputtered topological insulator (TI), which can be tuned by controlling the substrate temperature during the growth process of the TI material. This allows the TI to behave as an efficient spin sink when coupled with a ferromagnetic material, which in turn is an indicator for highly efficient Spin-orbit Torque (SOT) switching of magnetization states. A higher efficiency of charge to spin current conversion also means that magnetization oscillations can be excited very efficiently, as is needed for high frequency devices. Also, coupling the TI material with higher crystallinity, by using a higher substrate temperature during sputtering, causes an emergence of out of plane magnetic anisotropy (OPMA) in the adjacent ferromagnetic layer, which can be further tuned to achieve perpendicular magnetic anisotropy (PMA).

Embodiments can, for example: provide a highly efficient SOT memory which is non-volatile; provide high density PMA with thicker magnetic layers, which can be implemented in MRAM devices; and provide high frequency spin torque nano oscillators (STNO).

Definitions

As used herein, a "crystalline ordered" topological insulator is a topological insulator in which there is a crystalline structure and orientation, with crystalline axially oriented grains and observable diffraction peaks for the crystalline orientation.

As used herein, a "distinct interfacial layer" of diffused material is a dense, well-defined band of diffused material found adjacent to an interface between a ferromagnetic layer and a topological insulator in a cross-section of a heterostructure material, with the composition by atomic percentage of the diffused material in the topological insulator approaching zero rapidly outside the well-defined band of diffused material.

As used herein, "spin-mixing conductance" is the value $g_{\uparrow\downarrow}$ as found in FMR experiments, which can be calculated using the equation, $$g_{\uparrow\downarrow} = \frac{4\pi M_s d_{FM}}{\gamma \hbar} \Delta\alpha.$$

Here, $\Delta\alpha$ is the change in Gilbert's damping of the FM/NM heterostructure compared to the FM film ($\Delta\alpha = \alpha_{FM/NM} - \alpha_{FM}$), $M_s$ is the saturation magnetization obtained from fitting Kittel's equation $$\left(f_{res} = \frac{\gamma}{2\pi}\sqrt{H(H+4\pi M_s)}\right),$$

$d_{FM}$ is the thickness of the FM layer, $\gamma$ is the gyromagnetic ratio and h is the Plank's constant.

REFERENCES

1. J. C. Sloncewski, "Current-driven excitation of magnetic multilayers", JMMM, Vol 159, Issue 1-2, (1996).
2. L. Berger, "Emission of spin waves by a magnetic multilayer traversed by a current", Phys. Rev. B 54, 9353, 1996.
3. A. Fert et al., "Spin Hall Effect Induced by Resonant Scattering on Impurities in Metals", PRL 106, 157208, 2011.
4. T. Chen, et al., "Spin-Torque and Spin-Hall Nano-Oscillators", Proceedings of the IEEE, vol. 104, no. 10, pp. 1919-1945, 2016.
5. A. Manchon et al., "New perspectives for Rashba spin-orbit coupling", Nature Materials Vol 14, 2015.
6. L. Liu et al., "Spin-Torque Switching with the Giant Spin Hall Effect of Tantalum", Science Vol 336, 2012.
7. M. B. Jungfleisch et al., "Interface-driven spin-torque ferromagnetic resonance by Rashba coupling at the interface between nonmagnetic materials", Physical Review B 93, 224419, 2016.
8. A. R. Mellnik et al., "Spin-transfer torque generated by a topological insulator" Nature, Vol 511, 449, 2014.
9. M Belmeguenai, M. S. Gabor and F. Xigheim et al., J. Phys. D: Appl. Phys. Vol. 51p. 045002 (2018).
10. D. J. Thouless et al., "Quantized Hall Conductance in a Two-Dimensional Periodic Potential", Phys. Rev. Lett. 49, 405, 1982.
11. C. L. Kane et al. "A New Spin on the Insulating State", Science, Vol 13, 2016.
12. M. Z. Hasan, "Colloquium: Topological Insulators", Rev of Mod Phys. Vol 82, 2010.
13. C. Tang et al., "Dirac surface state-modulated spin dynamics in a ferrimagnetic insulator at room temperature", Sci. Adv. Vol. 4, no. 6, 2018.
14. Mahendra D. C et al., "Room-temperature high spin-orbit torque due to quantum confinement in sputtered Bi$_x$Se$_{(1-x)}$ films", Nature Materials, Vol 17, 800, 2018.
15. Mahendra D. C., "Room-temperature spin-to-charge conversion in sputtered bismuth selenide thin films via spin pumping from yttrium iron garnet", Appl. Phys. Lett. 114, 102401, 2019.

16. Q. Guo et al., "Electrically Tunable Wafer-Sized Three-Dimensional Topological Insulator Thin Films Grown by Magnetron Sputtering", arXiv:1901.02611
17. Z. H. Wang et al., "Granularity Controlled Nonsaturating Linear Magnetoresistance in Topological Insulator $Bi_2Te_3$ Films", Nano Lett. 14, 11, 6510-6514, 2014.
18. P. Wei et al., "Exchange-Coupling-Induced Symmetry Breaking in Topological Insulators", PRL 110, 186807, 2013.
19. H. Wang et al., "Surface-State-Dominated Spin-Charge Current Conversion in Topological-Insulator-Ferromagnetic-Insulator Heterostructures", PRL 117, 076601, 2016.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A thin film heterostructure material, the material comprising:
   a crystalline ordered topological insulator sputter deposited on a substrate comprising an amorphous material;
   an adjacent ferromagnetic material;
   the topological insulator being configured to provide spin-orbit torque to the ferromagnetic material sufficient to produce at least one of resonant excitation and switching of magnetization in the ferromagnetic material; and
   a distinct interfacial layer of diffused material from the ferromagnetic material in the topological insulator, at an interface of the topological insulator and the ferromagnetic material, the distinct interfacial layer configured to prevent diffusion of material from the ferromagnetic material into the topological insulator towards the substrate.

2. The thin film heterostructure material of claim 1, wherein the ferromagnetic material comprises at least a portion of a nonvolatile memory device.

3. The thin film heterostructure material of claim 2, wherein the nonvolatile memory device comprises a Magnetic Random Access Memory (MRAM) device.

4. The thin film heterostructure material of claim 1, wherein the ferromagnetic material comprises at least a portion of a Complementary Metal Oxide Semiconductor (CMOS) device.

5. The thin film heterostructure material of claim 1, wherein the topological insulator comprises a surface roughness of less than about 2 nm.

6. The thin film heterostructure material of claim 1, wherein the topological insulator is configured to provide a spin-mixing conductance on the order of at least $10^{21}$ per square meter in the ferromagnetic material.

7. The thin film heterostructure material of claim 1, wherein the ferromagnetic material comprises a thickness of less than about 10 nm.

8. The thin film heterostructure material of claim 1, wherein the topological insulator comprises a first metal comprising at least one of bismuth and antimony, and a second metal comprising at least one of tellurium and selenium.

9. The thin film heterostructure material of claim 8, wherein the topological insulator comprises bismuth telluride ($Bi_2Te_3$).

10. The thin film heterostructure material of claim 1, wherein the ferromagnetic material comprises at least one of: cobalt ferrite boron (CoFeB) and a material comprising nickel and iron.

11. The thin film heterostructure material of claim 1, wherein the substrate comprises amorphous silicon.

12. The thin film heterostructure material of claim 1, further comprising a capping layer to prevent oxidation of the heterostructure material.

13. The thin film heterostructure material of claim 1, wherein the topological insulator comprises a thickness of less than about 50 nm.

14. A thin film heterostructure material, the material comprising:
    a crystalline ordered topological insulator sputter deposited on a substrate comprising an amorphous material;
    an adjacent ferromagnetic material;
    the topological insulator being configured to provide spin-orbit torque to the ferromagnetic material sufficient to produce at least one of resonant excitation and switching of magnetization in the ferromagnetic material;
    the topological insulator being configured to provide a spin-mixing conductance on the order of at least $10^{21}$ per square meter in the ferromagnetic material.

* * * * *